(12) United States Patent
Suzuki et al.

(10) Patent No.: US 7,661,964 B2
(45) Date of Patent: Feb. 16, 2010

(54) CONNECTING PARTS AND MULTILAYER WIRING BOARD

(75) Inventors: Kazuaki Suzuki, Ishikawa-gun (JP); Masaki Taniguchi, Utsunomiya (JP)

(73) Assignees: Sony Corporation, Tokyo (JP); Sony Chemical & Information Device Corporation, Tokyo (JP)

( * ) Notice: Subject to any disclaimer, the term of this patent is extended or adjusted under 35 U.S.C. 154(b) by 139 days.

(21) Appl. No.: 11/882,028

(22) Filed: Jul. 30, 2007

(65) Prior Publication Data

US 2008/0176421 A1    Jul. 24, 2008

Related U.S. Application Data

(63) Continuation of application No. PCT/JP2006/301203, filed on Jan. 26, 2006.

(30) Foreign Application Priority Data

Feb. 2, 2005    (JP) .............................. 2005-026790

(51) Int. Cl.
*H01R 12/00* (2006.01)
(52) U.S. Cl. ...................................................... 439/74
(58) Field of Classification Search .................. 439/74, 439/66, 70, 71, 591
See application file for complete search history.

(56) References Cited

U.S. PATENT DOCUMENTS

| | | | |
|---|---|---|---|
| 5,219,293 A | | 6/1993 | Imamura |
| 5,334,029 A | * | 8/1994 | Akkapeddi et al. ............ 439/66 |
| 6,540,525 B1 | * | 4/2003 | Li et al. ......................... 439/66 |
| 6,846,184 B2 | * | 1/2005 | Fan et al. ....................... 439/66 |
| 7,159,313 B2 | * | 1/2007 | Sathe et al. .................... 29/846 |
| 2001/0012706 A1 | | 8/2001 | Imaeda |
| 2002/0074157 A1 | | 6/2002 | Kato et al. |

FOREIGN PATENT DOCUMENTS

| | | |
|---|---|---|
| JP | A 57-128472 | 8/1982 |
| JP | A 61-206107 | 9/1986 |
| JP | A 5-13913 | 1/1993 |
| JP | A 8-88062 | 4/1996 |
| JP | A 2001-230511 | 8/2001 |
| JP | A 2002-176239 | 6/2002 |
| JP | A 2004-139880 | 5/2004 |

* cited by examiner

*Primary Examiner*—Jean F Duverne
(74) *Attorney, Agent, or Firm*—Oliff & Berridge, PLC

(57) ABSTRACT

A connecting part for ensuring a secure connection includes first connecting terminals that are arranged on one face of a supporting member and second connecting terminals that are arranged on the back face of the supporting member. The supporting member may have an elastic body. The connecting terminals are interconnected by conductive films which are formed on the face of the supporting member. Connecting parts are arranged between circuit boards on which electronic parts are mounted, and the circuit boards are mutually fixed in the state in which the connecting parts are compressed. The first and second connecting terminals are pushed against lands on the circuit boards by restoring force of the connecting parts, and then the circuit boards are electrically interconnected.

8 Claims, 6 Drawing Sheets

PRIOR ART

CONNECTING PARTS AND MULTILAYER WIRING BOARD

CROSS-REFERENCE TO RELATED APPLICATIONS

The present invention is a Continuation of International Application No. PCT/JP2006/301203 filed Jan. 26, 2006, which claims priority to Japan Patent Document No. 2005-26790, filed on Feb. 2, 2005. The entire disclosure of the prior applications are hereby incorporated by reference herein in its entirety.

BACKGROUND

Exemplary embodiments of the present invention relate to a multilayer wiring board and, more particularly, to connecting parts which electrically connect circuit boards together and a multilayer wiring board which is laminated using the connecting parts.

Reference numeral 106 in FIG. 7 denotes a multilayer wiring board of conventional art. This multilayer wiring board 106 is composed of a plurality of single layer circuit boards 159 laminated with adhesive layers 149.

In each circuit board 159, wiring film 153 is arranged on a base substrate 152, and electronic parts 154 are mounted on the wiring film 153. The circuit boards 159 are connected by connecting parts 101. Here, the connecting part 101 is composed of a through the hole formed in the adhesive layer 149 and conductive material filled within the through-hole. The wiring films 153 of the adjacent circuit boards 159 are electrically connected each other by the connecting parts 101.

The connecting part 101 having the structure described above is called an "inner via." Other than this, the multilayer wiring board can be laminated by use of an as disclosed in JPA S61-206107 and JPA 2004-139880.

The inner via described above, however, requires processes for forming through-holes and for filling conductive material, thereby causing high cost and low reliability.

On the other hand, while a fabrication process becomes simple by using the electrode sheet, yield of the multilayer wiring board is low because of variations in electrode sheet thickness. Further, there is also a demand that connecting parts be mounted by using the same mounter as that for electronic parts.

SUMMARY

To solve the problem described above, embodiments of the present invention provide a connecting part that includes a supporting member including of elastic bodies having elastic force, a first connecting terminal provided on a first face of the supporting member, and a second connecting terminal provided on a second face, which is a back face of the first face of the supporting member, wherein the first and second connecting terminals are electrically connected.

In the embodiments of the present invention, the connecting part has a first conductive film formed on the first face, a second conductive film formed on the second face, a third conductive film formed on a third face, the third face connecting the first and second faces, wherein the first and second connecting terminals are arranged on the first and second conductive films, respectively, and the first and second conductive films are electrically connected by the third conductive film, and the first and second connecting terminals are electrically interconnected by the first, second, and third conductive films.

In the embodiments of the present invention, the connecting part has first and second connecting terminals that protrude from the face of the supporting member.

Embodiments of the present invention provide a connecting part, the connecting part including a supporting member, a first connecting terminal provided on a first face of the supporting member, a second connecting terminal provided on a second face, which is the back of the first face of the supporting member, the first and second connecting terminals are electrically connected, and elastic bodies having elastic force arranged on the first and second faces.

In embodiments of the present invention, the connecting part has the first and second connecting terminals which are formed to protrude from the first and second faces, wherein the height of the elastic body is made higher than that of the first and second connecting terminals.

In the embodiments of the present invention, the connecting part further includes a penetration hole provided in the supporting member, a conductive connecting portion arranged in the penetration hole, wherein the first and second connecting terminals are electrically connected by the conductive connecting portion.

In the embodiments of the present invention, a connecting part includes a third face connecting the first face and the second face, wherein first, second, and third conductive films are formed on the first, second, and third faces respectively, the first and second connecting terminals are arranged on the first and second conductive films, the first and second conductive films are electrically connected by the third conductive film, and the first and second connecting terminals are electrically interconnected by the first, second, and third conductive films.

Embodiments of the present invention include a multilayer wiring board which has a first wiring board having a first land, a second wiring board having a second land, a connecting part, and the first land and the second land are electrically connected by the connecting part, the connecting part including a supporting member composed of elastic bodies having elastic force, a first connecting terminal provided on a first face of the supporting member, and a second connecting terminal provided on a second face, which is the back face of the first face of the supporting member, wherein the first and second connecting terminals are electrically connected, first and second connecting terminals are in contact with the first and second lands, and the first and second wiring boards are fixed to each other in the state in which the supporting member is compressed.

Embodiments of the present invention include a multilayer wiring board including a first conductive film formed on the first face, a second conductive film formed on the second face, a third conductive film formed on a third face, the third face connects the first and second faces, wherein the first and second connecting terminals are arranged on the first and second conductive films, the first and second conductive films are electrically connected by the third conductive film, and the first and second connecting terminals are electrically interconnected by the first, second, and third conductive films.

In the embodiments of the present invention, a multilayer wiring board including a connection part is provided, wherein the first and second connecting terminals protrude from the surface of the supporting member.

Embodiments of the present invention include a multilayer wiring board which has first and second wiring boards having first and second lands, and connecting parts, wherein the first and second lands are electrically connected by the connecting parts, wherein the connecting part has a supporting member, a first connecting terminal provided on a first face of the supporting member, a second connecting terminal provided on a second face which is a rear face of the first face of the supporting member, and elastic bodies which have elastic force and are arranged on the first and second faces, and wherein the first and second connecting terminals are electrically connected, the first and second connecting terminals are contacted with the first and second lands, and the first and second wiring boards are mutually fixed in a state in which the elastic body is compressed.

Embodiments of the present invention include a multilayer wiring board which has a penetration hole provided in the supporting member, a conductive connecting portion arranged in the penetration hole, wherein the first and second connecting terminals are electrically connected by the conductive connecting portion, and the first and second lands are electrically connected each other via the connecting portion.

Embodiments of the present invention include a multilayer wiring board which has a first conductive film formed on the first faces, a second conductive film formed on the second faces, a third conductive film formed on a third faces, the third face connects the first and second faces, wherein the first and second connecting terminals are arranged on the first and second conductive films, the first and second conductive films are electrically connected by the third conductive film, and the first and second lands are electrically interconnected via the first, second, and third conductive films.

In spite of variations in the thickness of the connecting parts, the variations are resolved by deformation of the elastic bodies, so that the circuit boards are interconnected reliably.

Further, the connecting part can be mounted by the same mounter for electronic parts.

DETAILED DESCRIPTION OF EMBODIMENTS

Figure 1A:
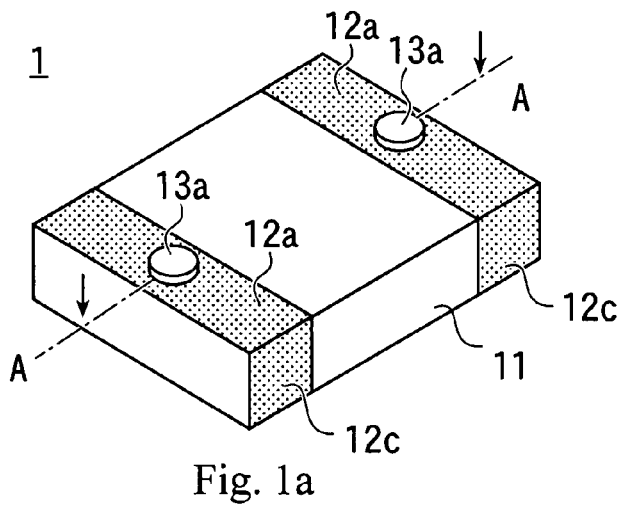
FIG. 1a is a perspective view of a first face side of a connecting part according to a first embodiment of the present invention.

A connecting part and a multilayer wiring board of the present invention will be described with reference to the drawings.

Numeral references 1, 2, and 3 of FIGS. 1a to 1c, FIGS. 2a to 2c, and FIGS. 3a to 3c denote connecting parts of first, second, and third embodiments of the present invention respectively. The connecting parts 1, 2, and 3 include supporting member 11, 21, and 31 having a substantially rectangular solid shape, respectively. The rectangular shaped body may be formed such that, of the length direction a, width direction b, and height direction h of the rectangular solid, the size of the length and width direction a, b are longer, and the size of the height direction h is shorter than those of length and width directions. The length a, width b, and height h may have sizes in the range of about 1 mm to several mm.

Assuming that the faces formed by the length direction a and the width direction b are a first face and a second face, the first and second faces are a front face and a back face, and the face formed by the height direction h and the length direction a, or by the height direction h and the width direction b is a side face.

The first and second faces are in contact with the side face, and the first face and the second face are connected by the side face. Assuming that the side face is a third face, first, second, and third conductive films 12a, 12b and 12c or 32a, 32b and 32c are formed on the first, second, and third faces respectively in the connecting part 1 of the first embodiment and the connecting part 3 of the third embodiment, respectively.

Figure 1B:
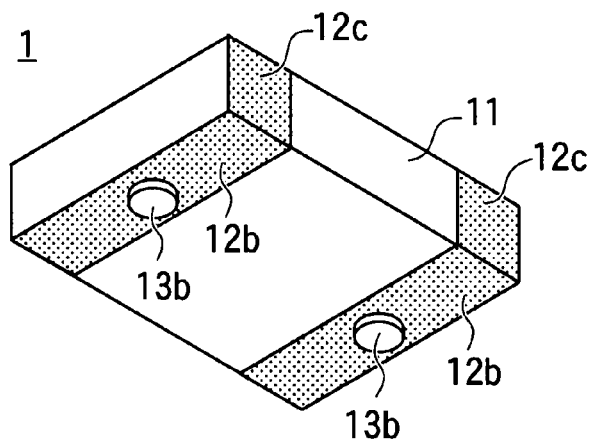
FIG. 1b is a perspective view of a second face side of the connecting part according to the first embodiment of the present invention.
Figure 1C:
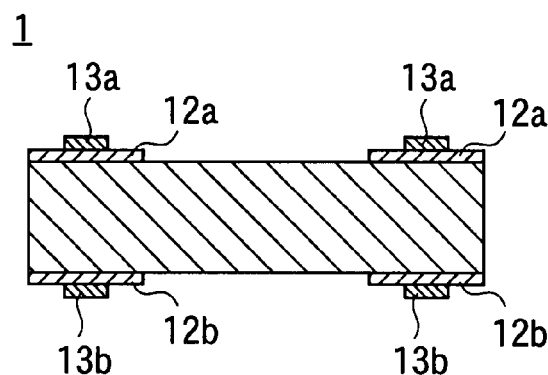
FIG. 1c is a cross-section view of the connecting part of FIG. 1a taken along the line A-A.
Figure 3A:
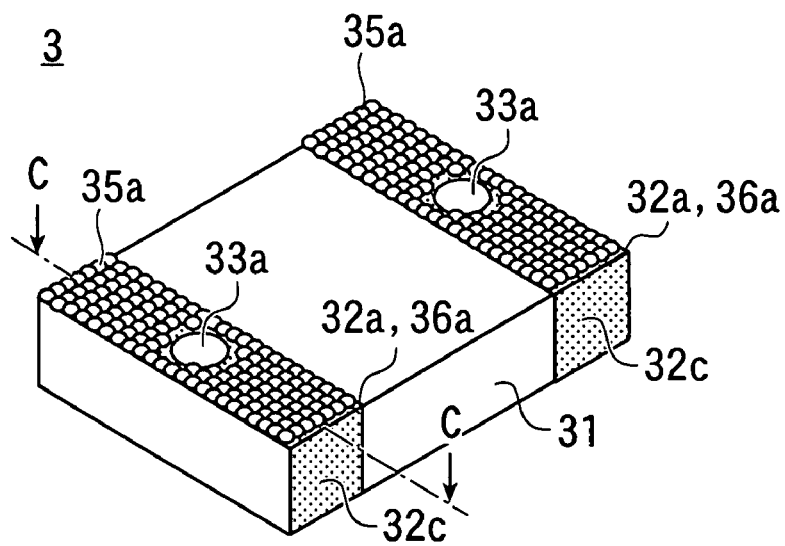
FIG. 3a is a perspective view of a first face side of a connecting part according to a third embodiment of the present invention.
Figure 3B:
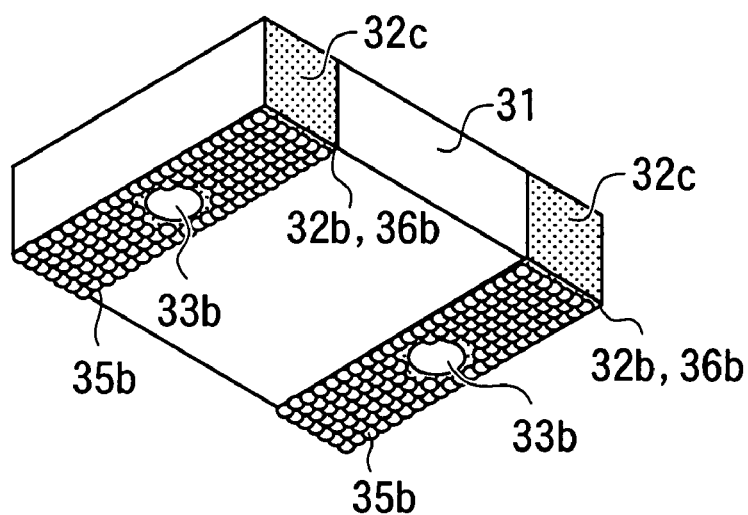
FIG. 3b is a perspective view of a second face side of the connecting part according to the third embodiment of the present invention.
Figure 3C:
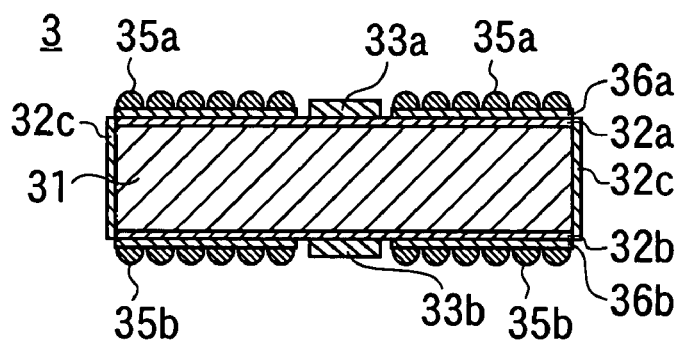
FIG. 3c is a cross-section view of the connecting part of FIG. 3a taken along the line C-C.

First, referring to FIGS. 1a to 1c and FIGS. 3a to 3c, the common structure of the connecting parts 1 and 3 of the first and third embodiments will be described. FIG. 1a and FIG. 3a are perspective views seen from the first face side, FIG. 1b and FIG. 3b are perspective views seen from the second face side, and FIG. 1c and FIG. 3c are cross-section views taken along the lines A-A and C-C.

The third conductive films 12c and 32c are contacted with both the first conductive films 12a and 32a and the second conductive films 12b and 32b so that the first conductive films 12a and 32a and the second conductive films 12b and 32b are electrically connected by the third conductive films 12c and 32c.

The first conductive films 12a and 32a and the second conductive films 12b and 32b are each separated into two or more (in this case, each two), and each of the separated second conductive films 12b and 32b may be arranged on the immediately back positions for each of the separated first conductive films 12a and 32a.

A plurality of first conductive films 12a and 32a may be electrically isolated from each other, and a plurality of second conductive films 12b and 32b may also be electrically isolated from each other. The first conductive films 12a and 32a and the second conductive films 12b and 32b at the immediately back positions thereof are respectively connected to the third conductive films 12c and 32c. Consequently, although the first conductive films 12a and 32a are electrically connected to the second conductive films 12b and 32b at the immediately rear positions, the first conductive films 12a and 32a are not electrically connected to the second conductive films 12b and 32b except the immediately back positions.

First connecting terminals 13a and 33a and second connecting terminals 13b and 33b may be formed on the first conductive films 12a and 32a and the second conductive films 12b and 32b, respectively. The first and second connecting terminals 13a, 33a, and 13b, 33b have conductivity, and are electrically connected to the first conductive films 12a and 32a and the second conductive films 12b and 32b respectively. Consequently, the first connecting terminals 13a and 33a and the second connecting terminals 13b and 33b are electrically connected.

The second connecting terminals 13b and 33b which are positioned on the second faces may be arranged on substantially immediate back positions of the first connecting terminals 13a and 33a which are positioned on the first faces.

The supporting member 11 of the connecting part 1 of the first embodiment may be composed of an elastic body such as synthetic rubber, and the supporting members 21 and 31 of the second and third embodiments are composed of members having stiffness such as ceramics and thermosetting resin.

As an example of the elastic body, resin can be used which has a coefficient of elasticity in the range of 4.71 GPa to 5.8 GPa, a softening point in the range of 200° C. to 300° C., and a coefficient of linear expansion of about 16 ppm.

First, the connecting part 1 of the first embodiment will be described. Since the second connecting terminal 13b may be positioned on the immediate back of the first connecting terminal 13a, upon pressing the first and second connecting terminals 13a and 13b to the supporting member 11 along the center direction of the thickness, the force to compress along the direction of thickness is applied to a part of the supporting member 11 where the position sandwiched between the first and second connecting terminals. When the force is applied, the part of the supporting member 11 is pressed toward the inner center along the direction of the thickness (direction of height h), it is partly compressed, thereby making the thickness partially thin.

By using this connecting part 1, a process for connecting wiring boards together and for fabricating a multilayer wiring board will be described.

Figure 4A:
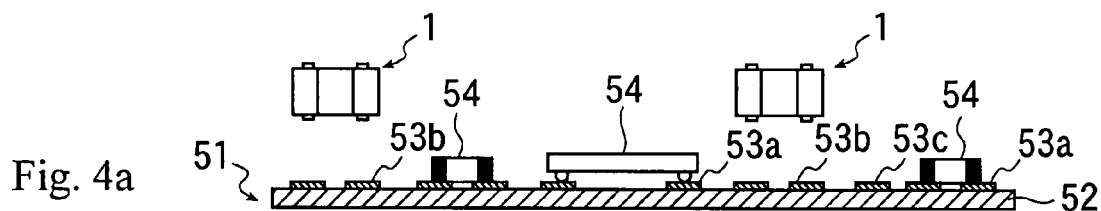
FIGS. 4a to 4c are drawings for explaining fabrication process of a multilayer wiring board according to an embodiment of the present invention.

Reference numeral 51 in FIG. 4a denotes a first circuit board as a target for multilayer, and the first circuit board 51 has the base substrate 52 and wiring film having conductivity and which is formed on at least one face of the base substrate 52.

As the base substrate 52, a substrate in which material having flexibility such as polyimide may be formed into film shape, and/or another substrate which has stiffness such as a glass epoxy substrate can be used. For base substrates 62, 82 of second and third circuit boards 69, 89 described below are the same.

The wiring film may be structured such that patterning is performed on copper foil adhered on the base substrates 52, 62, or 82, or on copper film made of copper thin film grown by the plating method.

Figure 4B:
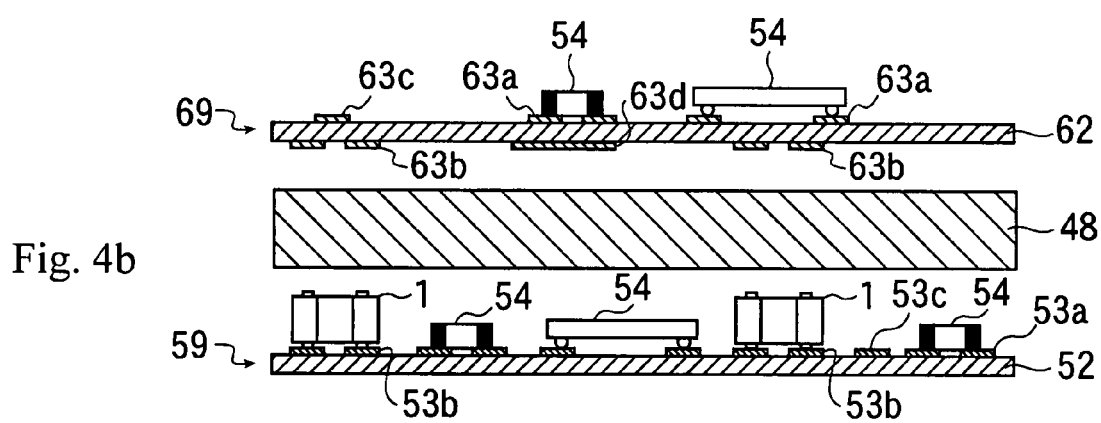
Figure 4C:
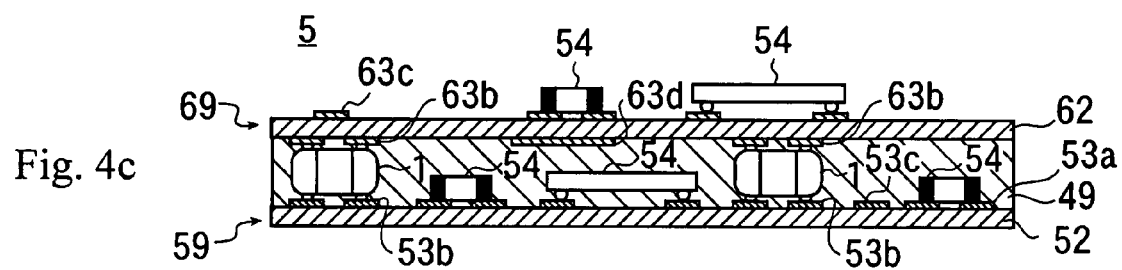

Reference numerals 53a and 53b in FIGS. 4a to 4c denote lands for electronic parts and lands for connecting parts which are composed of parts of these wiring films, and numeral 53c denotes connection wiring composed of wiring film which may be made of the different part of the same copper film.

The connection wiring 53c connects between the lands 53a for electronic parts each other, between the lands 53b for connecting parts each other, and between land 53a for electronic part and the land 53b for connecting part, thereby forming circuits.

Electronic parts 54 may be attached on the lands 53a for electronic parts, and integrated circuits or capacitors etc., within the electronic parts 54 are connected each other via the lands 53a, 53b, and the connection wiring 53c. The electronic parts 54 include active parts, such as packaged semiconductor chips and bare chips of semiconductor, and passive parts such as resistor elements, capacitors and inductors.

The surfaces of the lands 53b for connecting parts may be exposed. The first or second connecting terminal 13a, 13b of the connecting part 1 may be mounted on the lands 53b for connecting parts when they are connected. In this case, the first or second connecting terminal 13a, 13b and land 53b for connecting part may be connected by the low melting-point metal such as solder with heat treatment, or may be connected with conductive adhesive without heat treatment. They can be connected by an anisotropic conductive film at the same time when the other electronic parts 54 are connected.

Reference numeral 59 in FIG. 4b denotes a first circuit board in a state in which the connecting parts 1 are mounted. In this state, among the first and second connecting terminals 13a, 13b of the connecting parts 1, the surface of the first or second connecting terminals 13a, 13b which is not connected to the first circuit board 59 is exposed.

Reference numeral 69 in FIG. 4b denotes a second circuit board to be connected to the circuit board 59.

The second circuit board 69 has a base substrate 62, and wiring films having conductivity, such as copper films, are formed on the both faces of the base substrate 62.

Reference numerals 63a in FIG. 4b denote lands for electronic parts, which are positioned on one face of the second circuit board 69 and the electronic parts 54 would be mounted on, reference numerals 63b denote lands for connecting parts, which are positioned on opposite face of the second circuit board 69, and on which the connecting parts 1 are connected. Reference numerals 63c and 63d are connection wirings which connect between the lands 63a for electronic parts each other, between the lands 63b for connecting parts each other, and between the land 63a for electronic part and the land 63b for connecting part, and the connection wiring 63c and 63d are composed of a part of the wiring films except the part which the lands 63a for electronic parts and the lands 63b for connecting parts are composed.

Penetration holes filled with conductive material are formed in the base substrate 62, through holes are formed by the penetration holes and the conductive material. The lands 63a for electronic parts and the lands 63b for connecting parts on the back face thereof are directly and electrically connected by the through holes, or are electrically connected via the through holes and the connection wirings 63c and 63d.

When positioning of the first and second circuit boards 59 and 69 is performed, the lands 63b for connecting parts of the second circuit board 69 are arranged so as to be positioned immediately above the lands 53b for connecting parts of the first circuit board 59.

In the state that the first and second circuit boards 59 and 69 are aligned, an adhesive film 48 may be positioned between the first and second circuit boards 59 and 69, and then one circuit board may be pushed to the other circuit board.

At this time, the adhesive film 48 may be pressed by the first and second circuit boards 59 and 69 so that the electronic parts 54 and the connecting parts 1 are forced into the adhesive film 48.

By the pressing, the lands 63b for connecting parts of the second circuit board 69 reach the exposed first or second connecting terminal 13a, 13b of the connecting part 1.

If the adhesive film 48 is the anisotropic conductive film containing conductive particles therein, the first and second connecting terminals 13a, 13b are pushed against the lands 63b for connecting parts and electrically connected thereto via the conductive particles. If the adhesive film 48 contains no conductive particles, the first and second connecting terminals 13a, 13b are directly pushed and contacted to the lands 63b, and are electrically connected each other.

Then, by the more pressing, the connecting parts 1 are pressed and deformed.

In this state, the adhesive film 48 may be filled between the first and second circuit boards 59, 69, when the first and second circuit boards 59, 69 are heated while keeping pressure state, the adhesive film 48 may be raised in temperature to be hardened, and the first and second circuit boards 59, 69 are fixed each other. Consequently, as shown in FIG. 4c, the multilayer wiring board 5 is obtained. Reference numeral 49 in FIG. 4c denotes an adhesive layer formed by hardening of the adhesive film 48.

Since the adhesive film 48 may be hardened in the state in which the connecting parts 1 have been pressed and compressed, when the pressure is released, by restoring force of the connecting parts 1, the first and second circuit boards 59, 69, are fixed in the state in which the first and second terminals 13a, 13b are pushed to the lands 53b, 63b for connecting parts of the first and second circuit boards 59, 69. Owing to this, the electrical connection of the first and second circuit boards 59 and 69 becomes reliable.

In addition, in the process described above, the adhesive film 48 may be attached on the first circuit board 59 after the connecting part 1 is mounted on the first circuit board 59. However the first and second circuit boards 59, 69 may be stuck together in such a way that the connecting parts 1 are mounted on the first circuit board 59 side, the adhesive film 48 is adhered on the second circuit board 69 side, the adhesive film 48 and the connecting parts 1 are contacted with each other and then pressed.

Conversely, the first and second circuit boards 59, 69 may be stuck together in such a way that the connecting parts 1 are mounted on the second circuit board 69, the adhesive film 48 is arranged on the second circuit board 69 of which the connecting parts 1 are mounted on, the first circuit board 59 is pushed from thereon, and then the first and second circuit boards 59 and 69 are pressed.

In addition, the first and second circuit boards 59, 69 may be pushed together with the adhesive film 48 interposed therebetween, after the adhesive film 48 is attached to the first circuit board 59, and the connecting parts 1 are mounted on the second circuit board 69.

In sum, the connecting parts 1 are compressed and deformed, the first and second connecting terminals 13a, 13b are pushed against the lands 53b, 63b for connecting parts, and then the first and second circuit boards 59, 69 may be fixed together in the state in which the connecting parts 1 are deformed by the compression.

Figure 5A:
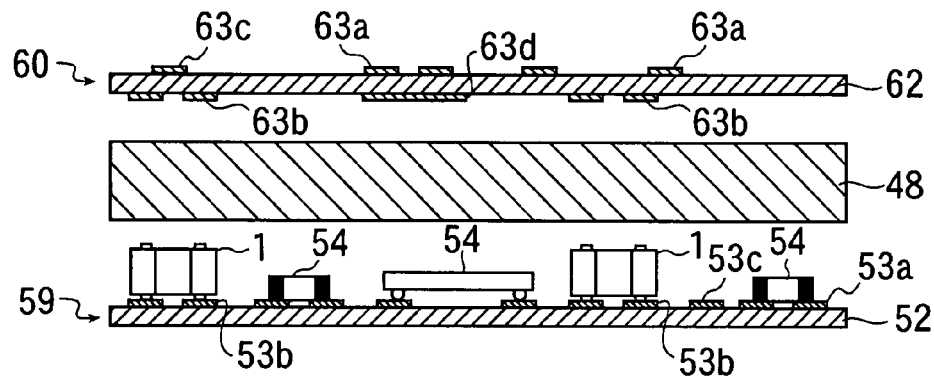
FIGS. 5a to 5c are drawings for explaining another fabrication process of the multilayer wiring board according to the embodiment of the present invention.

Also, the electronic parts may be mounted on the second circuit board, after the first and second circuit boards are adhered together. Referring to drawings, reference numerals 60 in FIGS. 5a to 5c denote second circuit board in the state in which no electronic part is mounted.

After the second circuit board 60 and the adhesive film 48 are pushed against the first circuit board 59 on which the electronic parts 54 and the connecting parts 1 are mounted, the first and second circuit boards 59, 60 are pressed together, and then, the adhesive film 48 is hardened to form adhesive layer 49 while the connecting parts 1 are deformed by the compression.

Figure 5B:
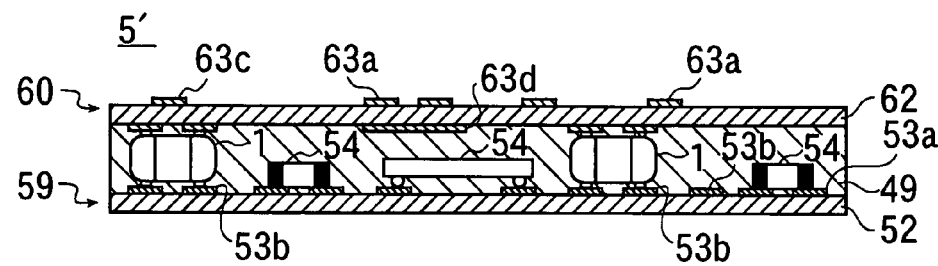

The distance between the first and second circuit boards 59, 60 is fixed by the adhesive layer 49, thus a multilayer wiring board 5' is obtained as shown FIG. 5b. In this state, by restoring force of the pressed connecting parts 1, the first and second connecting terminals 13a, 13b are pushed against the lands 53b, 63b for connecting parts.

Lands 63a for electronic parts are exposed on the surface of the second circuit board 60 side of the multilayer wiring board 5'.

Figure 5C:
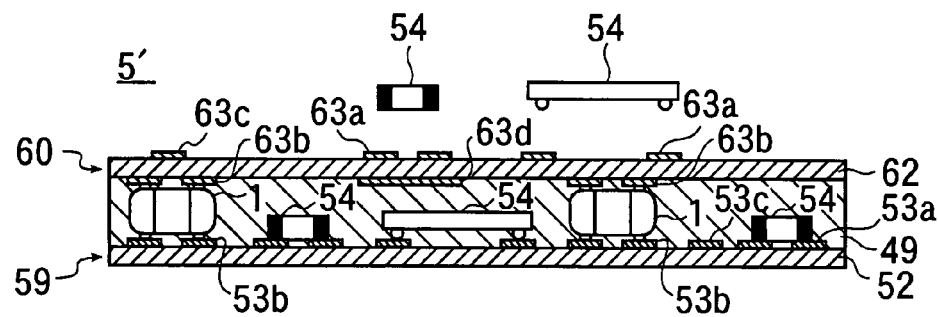

FIG. 5c is a schematic view of the multilayer wiring board 5' immediately before the electronic parts 54 are mounted. When the electronic parts 54 are mounted on the exposed lands 63a for electronic parts, the multilayer wiring board same as the multilayer wiring board 5 shown in FIG. 4c can be obtained.

In the embodiment described above, the lands 63b for connecting parts are formed on one face of each of first and second circuit boards 59, 60, and 69, so that the multilayer wiring board 5 consisting of two layers is obtained; however, by using a third circuit board which has lands for connecting electronic parts on both faces, a multilayer wiring board consisting of three or more layers can be obtained.

Figure 6:
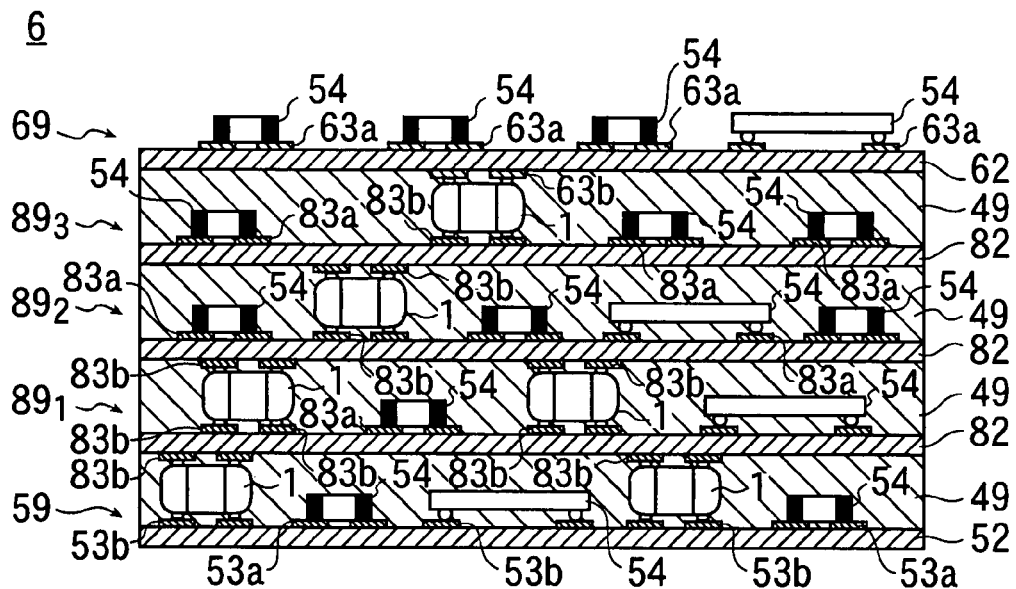
FIG. 6 is a drawing for explaining a multilayer wiring board according to another embodiment of the present invention.
Figure 7:
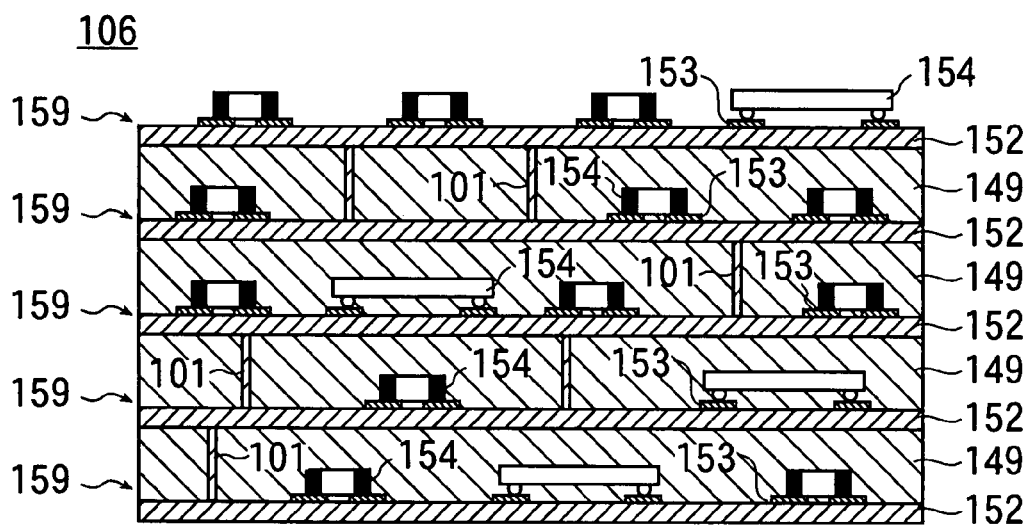
FIG. 7 is a drawing of a multilayer board of prior art.

Reference numeral 6 in FIG. 6 is a multilayer wiring board in which each one first and second circuit boards 59, 69 and one or more third circuit boards $89_1$ to $89_3$ are laminated.

The third circuit boards $89_1$ to $89_3$ have base substrates 82, and lands 83b for connecting parts are formed on the both faces of the base substrates 82.

One face of each of this third circuit boards $89_1$ to $89_3$ is connected to the first circuit board 59 or one of other third circuit boards $89_1$ to $89_3$; the other one face of each of this third circuit boards $89_1$ to $89_3$ is connected to the second circuit board 69 or one of other third circuit boards $89_1$ to $89_4$.

Lands 83a for electronic parts are arranged on at least one face of each of the third circuit boards $89_1$ to $89_3$, and the electronic parts 54 are mounted thereon.

A connection wiring (not shown) which electrically connects between the lands 83a for electronic parts each other, between the lands 83a for electronic parts and the lands 83b for connecting parts, or between the lands 83b for connecting parts each other may be arranged at least on the face where the electronic parts are mounted, among the both face of each of the third circuit boards $89_1$ to $89_3$. A wiring film which is connected to the lands 83b for connecting parts may be arranged also on the back face thereof.

The third circuit boards $89_1$ to $89_3$ have conductive through holes which penetrate the base substrate 82 in the thickness direction, through which the lands 83a for electronic parts or the lands 83b for connecting parts positioned on one face and the lands 83a for electronic parts or the lands 83b for connecting parts positioned on opposite face are electrically connected.

The third circuit boards $89_1$ to $89_3$ are arranged between the first circuit board 59 and the second circuit board 69, and are mutually fixed by the hardened adhesive layer 49.

The connecting parts 1 are arranged between the first and third circuit boards 59, $89_1$, between the third circuit boards $89_1$ to $89_3$, and between the third and second circuit boards $89_3$, 69; each connecting part 1, in the state of being compressed and deformed, electrically connects to lands 53b, 63b, and 83b of the first to third circuit boards 59, 69, and $89_1$ to $89_3$ which are positioned at both sides of the connecting part 1.

Accordingly, the electronic parts 54 on the first circuit board 59 are electrically interconnected with the electronic parts 54 on the third circuit boards $89_1$ to $89_3$, and the electronic parts 54 on the second circuit board 69.

Here, the multilayer wiring boards 5, 6 have lands for connecting to outer circuits, but they are not shown in the drawings.

Next, other connecting parts of exemplary embodiments of the present invention will be described.

Figure 2A:
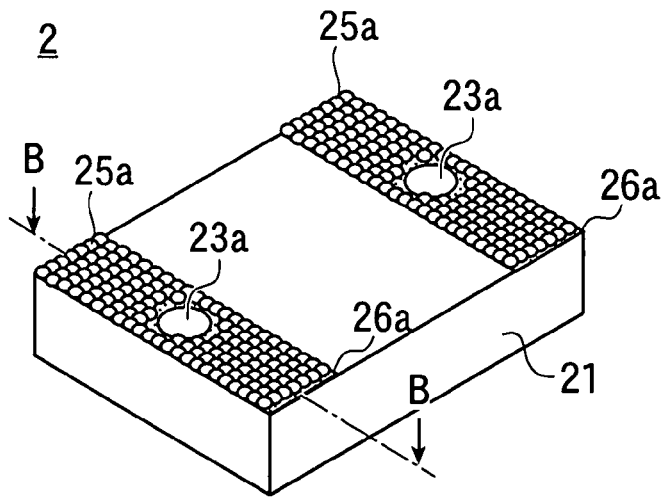
FIG. 2a is a perspective view of a first face side of a connecting part according to a second embodiment of the present invention.
Figure 2B:
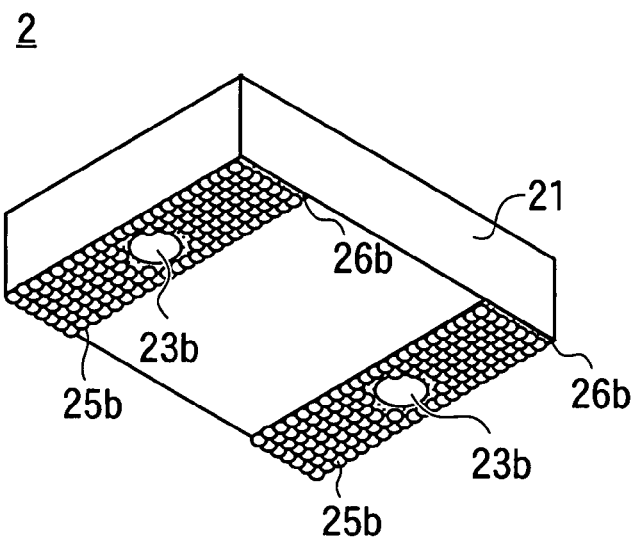
FIG. 2b is a perspective view of a second face side of the connecting part according to the second embodiment of the present invention.
Figure 2C:
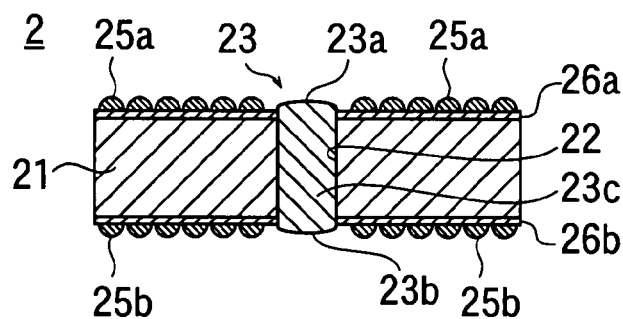
FIG. 2c is a cross-section view of the connecting part of FIG. 2a taken along the line B-B.

Reference numeral 2 in FIGS. 2a to 2c shows a connecting part of the second embodiment. The connecting part 2 includes a supporting member 21 having a substantially rectangular-solid shape.

FIG. 2a is a perspective view seen from a first face side, FIG. 2b is a perspective view seen from a second face side, and FIG. 2c is a cross-section view of FIG. 2a taken along the line B-B.

A through-hole 22 which penetrates the supporting member 21 in the thickness direction is formed therein, and a conductive plug 23 may be arranged within the through-hole 22 such that both ends of the plug protrude from each face of the first and second faces. Reference numerals 23a, 23b are the ends of the conductive plug 23, and denote first and second connecting terminals composed of the portions protruding from the first and second faces, respectively. Reference numeral 23c is a portion of the conductive plug 23 positioned within the through-hole 22, the portion is a connecting portion which connects the first and second connecting terminals 23a, 23b together.

Elastic bodies are arranged on at least one face of the first and second faces of the supporting member 21. In this embodiment, the elastic bodies are arranged on the both faces, reference numeral 25a denotes the elastic bodies arranged on the first face, reference numeral 25b denotes the elastic bodies arranged on the second face.

These elastic bodies 25a, 25b comprise, for example, spherical or half-spherical pieces of elastic bodies. Many elastic bodies 25a and 25b are attached to the faces of the supporting member 21 around the first and second connecting terminals 23a, 23b by adhesive layers 26a, 26b.

The adhesive layers 26a, 26b and elastic bodies 25a, 25b are not arranged on the first and second connecting terminals 23a, 23b, and the surfaces of the first and second connecting terminals 23a, 23b are exposed.

The heights of the first and second elastic bodies 25a, 25b from the supporting member 21 are made higher than those of the first and second connecting terminals 23a, 23b from the supporting member 21. It may be arranged such that, when the first or second face of the connecting parts 2 of the second embodiment is put on a flat surface, the first or second elastic bodies 25a, 25b are in contact with the flat surface, while the first and second connecting terminals 23a, 23b are not in contact with the flat surface and a gap is formed therebetween.

The connecting part 2 of the second embodiment can be used for the connecting part 1 of the first embodiment. For example, in the case of connecting the first and second circuit boards 59, 69, the connecting parts 2 of the second embodiment are put on the lands 53b for connecting parts of the first circuit board 59.

In this state, the elastic bodies 25a, 25b around the first and second connecting terminals 23a, 23b are closely contacted with the lands 53 for connecting parts, while a gap may be formed between the top of the first and second connecting terminals 23a, 23b and the lands 53b for connecting parts.

The other first or second connecting terminals 23a, 23b of the connecting parts 2 are pointed opposite to the first circuit board 59. Interposing the adhesive film 48, the lands 63b for connecting parts of the second circuit board 69 are made close to the first or second connecting terminals 23a, 23b directed to the opposite side, and the second circuit board 69 is pushed against the first circuit board 59 while interposing the adhesive film 48 therebetween, and then, the electronic parts 54 and the connecting parts 2 are forced into the adhesive film 48.

Then, the lands 63b for connecting parts of the second circuit board 69 are in contact with the elastic bodies 25a and 25b of the connecting part 2.

The supporting member 21 may be composed of a member having stiffness, for example, thermosetting resin or ceramics; when the first and second circuit boards 59, 69 are pressed, the elastic bodies 25a, 25b are compressed and deformed, and when the thickness of the elastic bodies 25a, 25b becomes thin, the first and second connecting terminals 23a, 23b are in contact with the lands 53b, 63b for connecting parts of the first and second circuit boards 59, 69.

When the adhesive film 48 is hardened in the state in which the first and second connecting terminals 23a, 23b are contacted with the lands 53b, 63b for connecting parts, and the adhesive layer 49 is formed, the first and second circuit boards 59, 69 are fixed each other by the adhesive layer 49 in the state of being electrically connected.

In the case of the connecting part 2 of the second embodiment, the first and second connecting terminals 23a, 23b are connected by the connecting portion 23c arranged within the through-hole 22, however, the present invention is not limited to this.

Reference numeral 3 in FIG. 3 denotes a connecting part of a third embodiment of the present invention.

In this connecting part 3, as described above, the first to third conductive films 32a, 32b and 32c are formed on the first to third faces of a supporting member 31 respectively, same as the connecting part 2 of the second embodiment, elastic bodies are arranged on at least one face of the first and second faces of the supporting member 31. In this embodiment, they are arranged on both faces, and reference numeral 35a denotes the elastic bodies arranged on the first face, reference numeral 35b denotes the elastic bodies arranged on the second face.

These elastic bodies 35a and 35b comprise, for example, spherical or half-spherical pieces of elastic bodies same as with the elastic bodies 23a and 23b of the connecting part 2 of the second embodiment, and the elastic bodies 35a and 35b are arranged around the first and second terminals 33a, 33b. In this embodiment, adhesive layers 36a and 36b are arranged being closely contacted with the first and second conductive films 32a, 32b and the first and second elastic bodies 35a, 35b are attached to the supporting member 31 by the adhesive layers 36a and 36b via the first and second conductive films 32a, 32b. The adhesive layers 36a and 36b may be arranged in close contact to the supporting member 31 and may be adhered to the supporting member 31 directly.

The adhesive layers 36a, 36b and the elastic bodies 35a, 35b are not arranged on the first and second connecting terminals 33a, 33b so that the surfaces of the first and second connecting terminals 33a, 33b are exposed.

The heights of the first and second elastic bodies 35a, 35b from the supporting member 31 are formed to be higher than those of the first and second connecting terminals 33a, 33b from the supporting member 31. It may be arranged such that, when the first or second face of the connecting parts 3 of the third embodiment is put on a flat surface, the first or second elastic bodies 35a, 35b are in contact on the flat face, while the first and second terminals 33a, 33b are not in contact with the flat surface and a gap is formed therebetween.

In the third connecting part 3 also, the supporting member 31 may be composed of material having stiffness. When the third connecting part 3 is pressed, and the elastic bodies 35a, 35b are deformed by the compression, the top surface of the first and second connecting terminals 33a, 33b reach the lands 53b, 63b, or 83b for connecting parts. in this state, when the first to third circuit boards 59, 69, and 89 sandwiching the connecting parts 3 are fixed each other, a multilayer wiring board having the state of keeping electrical connection between the first and second connecting terminals 33a, 33b and the lands 53b, 63b, or 83b for connecting parts can be obtained.

In addition, by using the connecting parts 2, 3 of the second and third embodiments instead of the connecting parts 1 of the first embodiment, connections between the third circuit boards 89$_1$ to 89$_3$ together, between the first circuit board 59 and the third circuit board 89$_1$, and between the second circuit board 69 and the third circuit board 89$_3$ of the multilayer wiring board 6 in FIG. 6 can be made.

Hardening of the adhesive film 48 is not limited to the heating; it may be ultraviolet radiation.

The circuit boards connected by using the connecting parts 1 to 3 are not limited to the first to third circuit boards 59, 69 and 89, and various kinds of circuit boards may be included.

Further, the connecting part of exemplary embodiments of the present invention can be used for connecting not only rigid circuit boards having stiffness each other or flexible circuit boards having flexibility each other, but also a rigid circuit board and a flexible circuit board together.

What is claimed is:

1. A connecting part comprising:
   a supporting member comprising an elastic body having elastic force;
   a first connecting terminal provided on a first face of the supporting member;
   a second connecting terminal provided on a second face;
   a first conductive film formed on the first face;
   a second conductive film formed on the second face; and
   a third conductive film formed on a third face, the third face connecting the first and second faces, wherein:
   the second face is a back face of the first face of the supporting member,
   the first and second connecting terminals are electrically connected,
   the first and second connecting terminals are arranged on the first and second conductive films, respectively,
   the first and second conductive films are electrically connected by the third conductive film, and
   the first and second connecting terminals are electrically interconnected by the first, second, and third conductive films.

2. The connecting part according to claim 1, wherein the first and second connecting terminals protrude from the surface of the supporting member.

3. A connecting part comprising:
   a supporting member;
   a first connecting terminal provided on a first face of the supporting member;
   a second connecting terminal provided on a second face, wherein the second face is a back of the first face of the supporting member, the first and second connecting terminals are electrically connected;
   elastic bodies having elastic force arranged on the first and second faces;
   a first conductive film formed on the first face;
   a second conductive film formed on the second face; and
   a third conductive film formed on a third face, the third face connecting the first and second faces, wherein:
   the first and second connecting terminals are arranged on the first and second conductive films, respectively,
   the first and second conductive films are electrically connected by the third conductive film, and
   the first and second connecting terminals are electrically connected by the first, second, and third conductive films.

4. The connecting part according to claim 3, wherein the first and second connecting terminals are formed so as to protrude from the first and second faces, and a height of the elastic bodies is made to be higher than a height of the first and second connecting terminals.

5. A multilayer wiring board comprising a first wiring board having a first land, a second wiring board having a second land, and a connecting part, and the first land and the second land being electrically connected by the connecting part,
   the connecting part comprising:
   a supporting member comprising an elastic body having elastic force;
   a first connecting terminal provided on a first face of the supporting member; and
   a second connecting terminal provided on a second face, wherein:
   the second face is a back face of the first face of the supporting member,
   the first and second connecting terminals are electrically connected,
   the first and second connecting terminals are in contact with the first and second lands, and
   the first and second wiring boards are fixed to each other in a state in which the supporting member is compressed.

6. The multilayer wiring board according to claim 5, the connecting part further comprising:
   a first conductive film formed on the first face;
   a second conductive film formed on the second face; and
   a third conductive film formed on a third face, the third face connecting the first and second faces, wherein:
   the first and second connecting terminals are arranged on the first and second conductive films,
   the first and second conductive films are electrically connected by the third conductive film, and
   the first and second connecting terminals are electrically interconnected by the first, second, and third conductive films.

7. The multilayer wiring board according to claim 5, wherein in the connecting part, the first and second connecting terminals protrude from the surface of the supporting member.

8. A multilayer wiring board comprising a first wiring board having a first land, a second wiring board having a second land, and a connecting part, the first land and the second land being electrically connected by the connecting part,
   the connecting part comprising:
   a supporting member;
   a first connecting terminal provided on a first face of the supporting member;
   a second connecting terminal provided on a second face, wherein the second face is a back face of the first face of the supporting member;
   elastic bodies having elastic force are arranged on the first and second faces;
   a first conductive film formed on the first face;
   a second conductive film formed on the second face; and
   a third conductive film formed on a third face, the third face connecting the first and second faces, wherein:
   the first and second connecting terminals are electrically connected,
   the first and second connecting terminals are in contact with the first and second lands,
   the first and second wiring boards are mutually fixed in a state in which the elastic bodies are compressed,
   the first and second connecting terminals are arranged on the first and second conductive films,
   the first and second conductive films are electrically connected by the third conductive film, and
   the first and second lands are electrically interconnected via the first, second, and third conductive films.

* * * * *